(12) United States Patent
Lu

(10) Patent No.: US 6,803,753 B2
(45) Date of Patent: *Oct. 12, 2004

(54) FREQUENCY PHASE DETECTOR FOR DIFFERENTIATING FREQUENCIES HAVING SMALL PHASE DIFFERENCES

(75) Inventor: Shih-Lien L. Lu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 31 days.

This patent is subject to a terminal disclaimer.

(21) Appl. No.: 10/338,187

(22) Filed: Jan. 7, 2003

(65) Prior Publication Data

US 2003/0137290 A1 Jul. 24, 2003

Related U.S. Application Data

(63) Continuation of application No. 09/740,920, filed on Dec. 19, 2000, now Pat. No. 6,538,517.

(51) Int. Cl.[7] .............................................. G01R 23/00
(52) U.S. Cl. ............................... 324/76.52; 324/76.53; 331/17
(58) Field of Search ..................... 324/76.41, 76.52, 324/76.53; 331/25, 11, 14, 17; 375/327; 327/147; 329/325, 360; 455/260

(56) References Cited

U.S. PATENT DOCUMENTS

| 4,322,643 | A | * | 3/1982 | Preslar | 327/5 |
|---|---|---|---|---|---|
| 4,464,771 | A | * | 8/1984 | Sorensen | 375/374 |
| 5,109,394 | A | * | 4/1992 | Hjerpe et al. | 375/373 |
| 5,173,617 | A | * | 12/1992 | Alsup et al. | 327/158 |
| 5,473,283 | A | * | 12/1995 | Luich | 331/8 |
| 5,506,878 | A | * | 4/1996 | Chiang | 377/39 |
| 5,532,636 | A | * | 7/1996 | Mar et al. | 327/543 |
| 5,646,564 | A | * | 7/1997 | Erickson et al. | 327/158 |
| 5,663,689 | A | * | 9/1997 | Baumgartner et al. | 331/17 |
| 5,677,648 | A | * | 10/1997 | Jones | 331/17 |
| 5,740,213 | A | * | 4/1998 | Dreyer | 375/374 |
| 5,815,016 | A | * | 9/1998 | Erickson | 327/158 |
| 5,815,041 | A | * | 9/1998 | Lee et al. | 331/8 |
| 5,936,445 | A | * | 8/1999 | Babanezhad et al. | 327/157 |
| 5,955,928 | A | * | 9/1999 | Smith et al. | 331/2 |
| 6,011,822 | A | * | 1/2000 | Dreyer | 375/376 |
| 6,075,406 | A | * | 6/2000 | Lee et al. | 327/538 |
| 6,111,470 | A | * | 8/2000 | Dufour | 331/17 |
| 6,160,432 | A | * | 12/2000 | Rhee et al. | 327/157 |
| 6,255,873 | B1 | * | 7/2001 | Johnson et al. | 327/157 |
| 6,292,061 | B1 | * | 9/2001 | Qu | 331/17 |
| 6,313,707 | B1 | * | 11/2001 | Fischer et al. | 331/17 |
| 6,316,977 | B1 | * | 11/2001 | Sargeant | 327/157 |
| 6,320,435 | B1 | * | 11/2001 | Tanimoto | 327/156 |
| 6,356,157 | B1 | * | 3/2002 | Kawamura | 331/11 |
| 6,392,499 | B1 | * | 5/2002 | Sato | 332/100 |
| 6,396,355 | B1 | * | 5/2002 | Rezin | 331/18 |
| 6,407,601 | B1 | * | 6/2002 | Lin | 327/158 |
| 6,614,317 | B2 | * | 9/2003 | Wong et al. | 331/17 |

* cited by examiner

Primary Examiner—Anjan Deb
Assistant Examiner—Walter Benson
(74) Attorney, Agent, or Firm—Blakely, Sokoloff, Taylor & Zafman LLP

(57) ABSTRACT

The invention provides a structure, method and apparatus for receiving a reference frequency and a variable frequency, differentiating the frequencies, and generating a logic pulse in response to a first frequency leading a second frequency, the frequencies having a small phase difference. In an aspect, the invention maintains a signal when the reference frequency and the variable frequency transition. In another aspect, the invention provides additional timing balance to prevent early generation of the logic pulses. In another aspect, the logic pulses drive a charge pump used in one of a phase-locked loop and a delay-locked loop.

20 Claims, 4 Drawing Sheets

FREQUENCY PHASE DETECTOR FOR DIFFERENTIATING FREQUENCIES HAVING SMALL PHASE DIFFERENCES

RELATED APPLICATION

This is a continuation of application Ser. No. 09/740,920, filed on Dec. 19, 2000, now U.S. Pat. No. 6,538,517 issued Mar. 25, 2003.

FIELD

The invention relates to a phase detector, more particularly, a frequency phase detector for differentiating frequencies having small phase differences, and generating a pulse in response to a first frequency leading a second frequency, the pulses driving a charge pump used in one of a phase-locked loop and a delay-locked loop.

BACKGROUND

Operating speeds of microprocessors and other digital systems are increasing in frequencies. At higher frequencies the timing delays and other uncertainties associated with the clock signal generation and distribution in a system are critical factors in a systems overall performance and reliability. System performance is optimized by carefully considering the attributes of the components used in designing the clock circuit, an important component in any synchronous digital system. A clock circuit includes clock generation and clock distribution. Clock generation takes the output of some oscillator source and manipulates it to obtain pulses with a specific frequency, duty cycle, and amplitude. These signals are then fanned out to various system components by a clock distribution network. As system speeds rise, the uncertainties of meeting setup, hold, and pulse duration requirements become critical due to a narrowing time window. Therefore, each component of a clocking circuit must be carefully designed and be high performance.

Phase-locked loop (PLL) and delay-locked loop (DLL) circuits are often used in clocking circuits. A conventional PLL, shown in FIG. 1, consists of five components including phase detector 4, charge pump 6, low pass filter 8, voltage controlled oscillator 10, and programmable frequency divider 12. As shown, phase detector 4 includes an input for receiving reference frequency 14 and a second input for receiving variable frequency 18. Phase detector 4 generates a phase difference between reference frequency 14 and variable frequency 18. The phase difference is used as an input to charge pump 6 which generates a variable voltage. The voltage passes through low pass filter 8 to remove noise and is used as an input to voltage controlled oscillator 10 to vary the frequency. A feedback loop extends from voltage controlled oscillator 10 to programmable frequency divider 12 to phase detector 4. Programmable frequency divider 12 divides the frequency from voltage controlled oscillator 10 by hundreds or thousands of numerical values, as selected.

A traditional CMOS implementation of a phase detector, consisting of two flip flops, is shown in FIG. 2. The traditional phase detector often includes a logic NAND gate and when both inputs to the logic NAND gate are high, then the flip flop reset signal is activated, bringing the flip flop output to ground. A RS latch is also used as part of a phase detector circuit.

BRIEF DESCRIPTION OF THE DRAWINGS

Additional advantages of the invention will become apparent upon reading the following detailed description and upon reference to the drawings, in which.

DETAILED DESCRIPTION

Exemplary embodiments are described with reference to specific configurations. Those skilled in the art will appreciate that various changes and modifications can be made while remaining within the scope of the claims.

Figure 1:
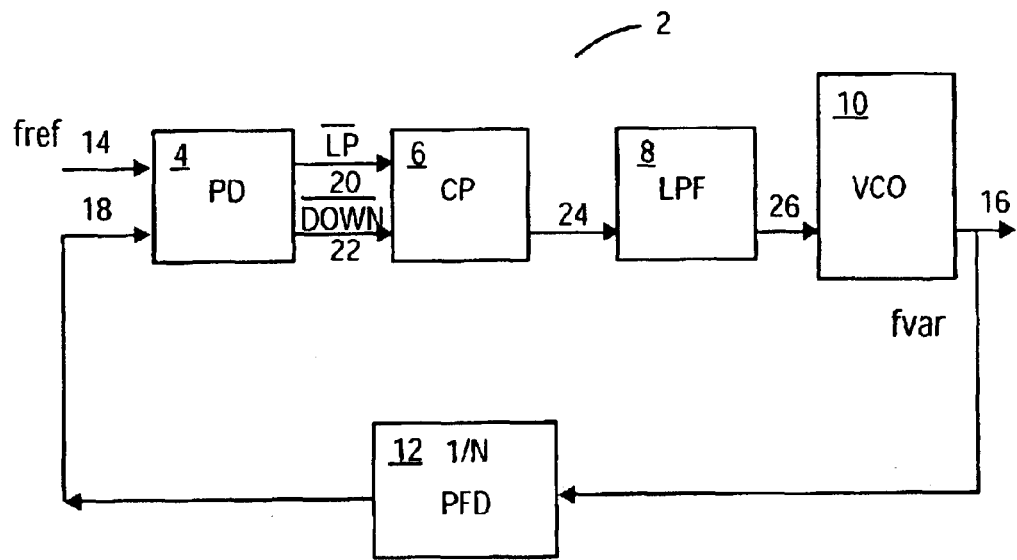
FIG. 1 is a block diagram showing a conventional phase-locked loop.
Figure 2:
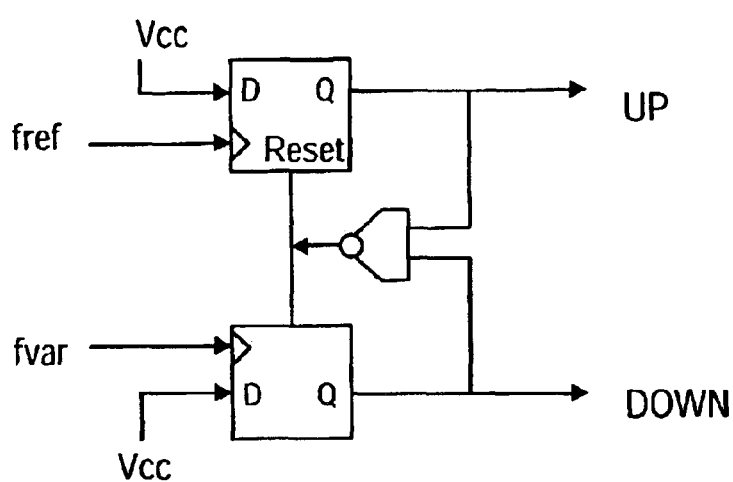
FIG. 2 is a schematic diagram showing a conventional phase detector including bistable multivibrators, also known as flip flops.

Most digital phase detectors, like those shown in FIG. 2 exhibit a period of low gain or no gain, termed dead zone, when a phase difference of two inputs is so small that a conventional phase detector cannot generate an arbitrary short pulse to steer a charge pump. The inability of controlling charge pump 6 at fine phase differences causes voltage controlled oscillator 10 to fluctuate randomly between bounds determined by the shortest pulse phase detector 4 is able to create. Therefore, it is critical to design a phase detector that is capable of responding to small phase differences between reference frequency 14 and variable frequency 18.

In an embodiment, the present invention provides an apparatus, method and means for responding to small phase differences between a reference frequency and a variable frequency, or essentially no dead zone. In an embodiment, phase detector 4 detects and reacts to phase differences of at least twenty picoseconds between reference frequency 14 and variable frequency 18. In an embodiment, phase detector 4 detects and reacts to phase differences smaller than twenty-one picoseconds. As discussed in the appended claims, an embodiment of the invention detects and reacts to "small" phase differences such as conventionally detectable phase differences and less, including phase differences less than twenty-one picoseconds, between a reference frequency and a variable frequency. In another embodiment, the invention is used as part of a DLL.

Figure 3:
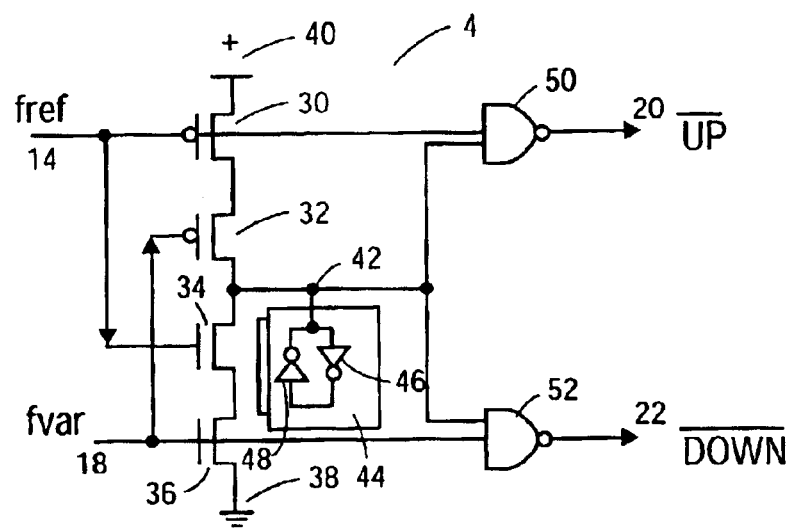
FIG. 3 is a schematic diagram of an embodiment of the invention.

As shown in FIG. 3, in an embodiment, the invention uses twelve transistors, logic NAND gate 50 and logic NAND gate 52 each include four transistors, and four transistors are coupled to Node 42. Latch keeper 44 is optionally coupled to node 42. Conventional phase detectors use more transistors than the present invention, with each flip-flop having about sixteen transistors. Having less transistors than conventional phase detectors, an embodiment of the invention decreases the path for signals, leading to better matched paths during production. Further, having fewer transistors reduces power consumption during circuit operation and also reduces production costs.

In an embodiment, the invention includes two circuits. One circuit receives two input frequencies, reference frequency 14 and variable frequency 18, and differentiates the two frequencies. In an embodiment, reference frequency 14 is an output of an oscillator. A second circuit, coupled to the first circuit, receives the differentiated frequencies and generates two output signals, inverse UP 20 and inverse DOWN 22 used as an input to charge pump 6. In an embodiment, inverse UP 20 charges charge pump 6, and inverse DOWN 22 reduces any charge on stored by charge pump 6. In an embodiment, variable frequency 18 is a feedback frequency coupled with the output of the second circuit, after having passed through other circuit components including charge pump 6, low pass filter (LPF) 8, voltage controlled oscillator (VCO) 10, and programmable frequency divider (PFD) 12. VCO 10 varies reference frequency 14 according to the output of phase detector 4. As an example, if reference frequency 14 leads or lags variable frequency 18, VCO 10 adjusts reference frequency 14 in time to obtain an output with desired frequency, duty cycle, and amplitude. In an embodiment, the duty cycles of reference frequency 14 and variable frequency 18 is low for fifty percent of the time and high for fifty percent of the time.

When used in this description, "low" refers to a logical low voltage level and "high" refers to a logical high voltage level. The specific voltage level for a high condition or a low condition is dependent on the logic family used, including complementary metal-oxide semiconductor (CMOS), transistor-transistor logic (TTL), etc.

In an embodiment, a system is provided. The system includes a central processing unit (CPU), a memory section, and an input/output (I/O) section. The CPU, memory section, and the I/O section are connected by an address bus, a data bus and a control bus. The CPU includes a clocking circuit, the clocking circuit includes a phase lock loop, the phase lock loop includes phase detector 4, a charge pump, a low pass filter, a voltage controlled oscillator, and a programmable frequency divider. In an embodiment, phase detector 4 is replaced by phase detector 72.

Figure 4A:
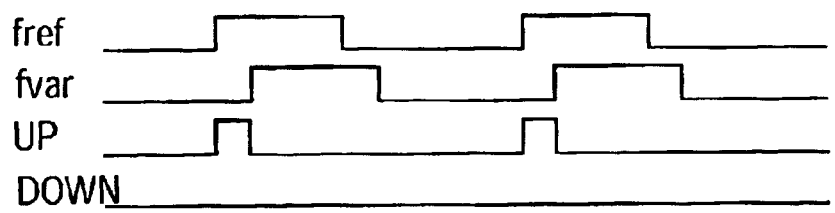
FIG. 4a is a timing diagram showing the response of UP and DOWN to changes in reference frequency and variable frequency, or more specifically when reference frequency leads variable frequency, in an embodiment of the invention.
Figure 4B:
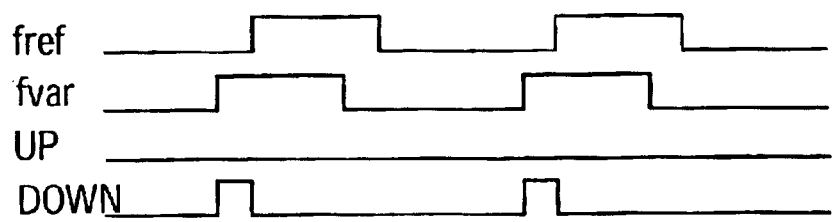
FIG. 4b is a timing diagram showing the response of UP and DOWN to changes in reference frequency and variable frequency, or more specifically when variable frequency leads reference frequency, in an embodiment of the invention.

In an embodiment, as shown in FIG. 3, the circuit operates as follows. When reference frequency 14 is low and variable frequency 18 is low, then transistor 30 is in a conducting state "on", transistor 32 is on, transistor 34 is in a non-conducting state "off", transistor 36 is off, and bias voltage (Vcc) 40 charges node 42. Logic NAND gate 50, having two inputs, receives a low in one input, a high in a second input, and outputs a high to inverse UP 20. NAND gate 52, also having two inputs, receives a low in one input, a high in a second input, and outputs a high to inverse DOWN 22. As shown in FIG. 4a and FIG. 4b, when reference frequency 14 is low and variable frequency 18 is low, then UP is low and DOWN is low.

When reference frequency 14 goes high and variable frequency 18 is low, transistor 30 is off, transistor 32 is on, transistor 34 is on, transistor 36 is off, and Vcc 40 stops charging node 42. Logic NAND gate 50 receives a high in both inputs and outputs a low to inverse UP 20. Logic NAND gate 52 receives a high in one input and a low in a second input and outputs a high to inverse DOWN 22. As shown in FIG. 4a and FIG. 4b, when reference frequency 14 is high and variable frequency 18 is low, then UP is high and DOWN is low. That is, inverse UP generates a pulse when reference frequency 14 leads variable frequency 18. The pulse has the effect of shifting in time the function that the reference frequency relates.

When reference frequency 14 is high and variable frequency 18 goes high, transistor 30 is off, transistor 32 is off, transistor 34 is on, transistor 36 is on, and node 42 discharges to ground 38. Logic NAND gate 50 receives a high in one input, a low in a second input, and outputs a high to inverse UP 20. Logic NAND gate 52 receives a low in one input, a high in a second input and outputs a high to inverse DOWN 22. As shown in FIG. 4a and FIG. 4b, when reference frequency 14 is high and variable frequency 18 is high, then UP is low and DOWN is low.

When reference frequency 14 is low and variable frequency 18 goes high, transistor 30 is on, transistor 32 is off, transistor 34 is off, transistor 36 is on, and Vcc 40 stops charging node 42. Logic NAND gate 50 receives a low in one output, a high in a second output and outputs a high to inverse UP 20. Logic NAND gate 52 receives a high in both inputs and outputs a low to inverse DOWN 22. As shown in FIG. 4a and FIG. 4b, when reference frequency 14 is low and variable frequency 18 is high, then UP is low and DOWN is high. That is, inverse DOWN generates a pulse when variable frequency 18 leads reference frequency 14. Again, the pulse has the effect of shifting in time the function that the reference frequency relates.

In an embodiment, latch keeper 44, a cross-coupled inverter, having inverter 46 and inverter 48, maintains a value at logic NAND gate 50 and logic NAND gate 52 while there is no charging path from Vcc 40 to node 42. That is, when reference frequency 14 transitions from low to high, and variable frequency 18 is low, there is no charging path from Vcc 40 to node 42, and node 42 may experience leakage, thereby loosing its value.

Figure 5:
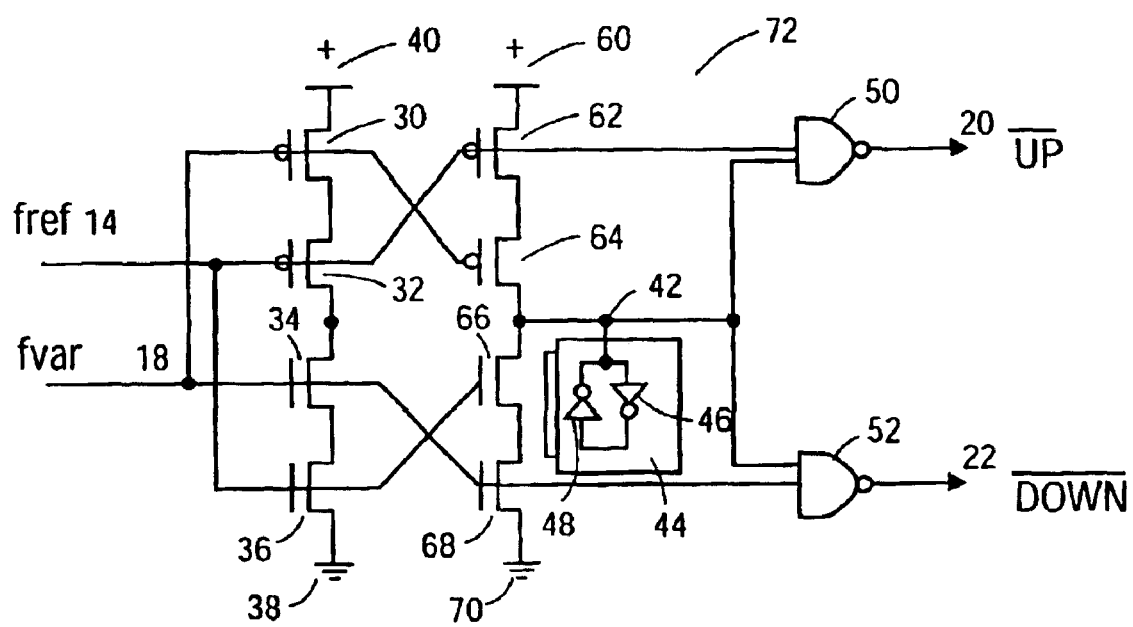
FIG. 5 is a schematic diagram of an embodiment of the invention.

As shown in FIG. 5, an embodiment of the invention, phase generator 72 is provided. Phase generator 72 utilizes phase generator 4 and connects additional transistors to variable frequency 18 and reference frequency 14 to provide additional timing balance to prevent early generation to one of inverse UP 20 and inverse DOWN 22. That is, as shown in FIG. 3, reference frequency 14 is connected to the upper PMOS transistor and upper NMOS transistor, PMOS 30 and NMOS 34 respectively. Variable frequency 18 is connected to the lower PMOS transistor and lower NMOS transistor, PMOS 32 and NMOS 36 respectively. This connection arrangement may result in a speed preference to either inverse UP 20 or inverse DOWN 22. Therefore, as shown in FIG. 5, the PMOS transistors are cross-coupled and the NMOS transistors are cross-coupled. That is, for example, reference frequency 14 is connected to an upper and lower PMOS transistor, and an upper and lower NMOS transistor. Similarly, variable frequency 18 is connected to an upper and lower PMOS transistor, and an upper and lower NMOS transistor. Preference to either inverse UP 20 or inverse DOWN 22 is thereby cancelled. The additional transistors include PMOS 62, PMOS 64, NMOS 66 and NMOS 68. Vcc 60 is connected to PMOS 62, and ground 70 is connected to NMOS 68.

Figure 6:
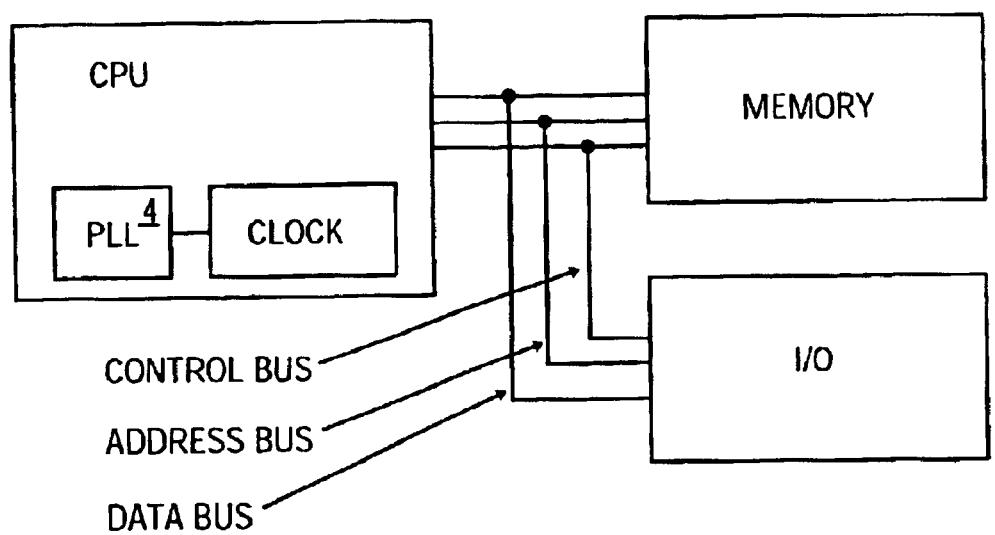
FIG. 6 is a schematic diagram of a computer system with a phase lock loop.

FIG. 6 illustrates an embodiment, wherein a system is provided. The system includes a central processing unit (CPU), a memory section, and an input/output (I/O) section. The CPU, memory section, and the I/O section are connected by an address bus, a data bus and a control bus. The CPU includes a clocking circuit, the clocking circuit includes a phase lock loop, the phase lock loop includes phase detector 4, a charge pump, a low pass filter, a voltage controlled oscillator, and a programmable frequency divider. In an embodiment, phase detector 4 is replaced by phase detector 72.

Having disclosed exemplary embodiments, modifications and variations may be made to the disclosed embodiments while remaining within the spirit and scope of the invention as defined by the appended claims.

What is claimed is:

1. An apparatus comprising:
   a first circuit to receive a reference frequency and a variable frequency and differentiate said frequencies; and
   a second circuit coupled to said first circuit, to receive said differentiated frequencies, and having two outputs;
   wherein one of said two outputs generates a logic pulse in response to one of said reference frequency leading said variable frequency and said variable frequency leading said reference frequency; and
   wherein said reference frequency and said variable frequency having a small phase difference.

2. The apparatus of claim 1, further comprising:
   a charge pump coupled to said second circuit, said charge pump driven by said logic pulse.

3. The apparatus of claim 2, further comprising:
   a low pass filter coupled to an output of said charge pump.

4. The apparatus of claim 2, further comprising:
   a voltage controlled oscillator coupled to an output of said charge pump.

5. The apparatus of claim 4, further comprising a frequency divider coupled to an output of said voltage controlled oscillator.

6. The apparatus of claim 1, wherein said first circuit includes four transistors.

7. The apparatus of claim 1, wherein said first and second circuits combined include less than 14 transistors.

8. The apparatus of claim 1, wherein said small phase difference is less than twenty pico seconds.

9. The apparatus of claim 1, wherein said reference frequency is greater than fifty gigahertz.

10. The apparatus of claim 1, wherein said reference frequency has a duty cycle of fifty percent.

11. A method comprising:
    receiving a reference frequency and a variable frequency and differentiating said frequencies in a first circuit; and
    receiving said differentiated frequencies, and generating a logic pulse in a second circuit in response to one of said reference frequency leading said variable frequency and said variable frequency leading said reference frequency,
    wherein said reference frequency and said variable frequency having small phase differences.

12. The method of claim 11, further comprising:
    driving a charge pump with said logic pulse.

13. The method of claim 11, wherein said small phase difference is less than twenty pico seconds.

14. The method of claim 11, wherein said reference frequency is greater than fifty gigahertz.

15. The method of claim 11, wherein said reference frequency has a duty cycle of fifty percent.

16. An apparatus comprising:
    first circuit for receiving a reference frequency and a variable frequency and differentiating said frequencies; and
    second circuit means for receiving said differentiated frequencies, and generating a logic pulse in response to one of said reference frequency leading said variable frequency and said variable frequency leading said reference frequency,
    wherein said reference frequency and said variable frequency having small phase differences.

17. The apparatus as in claim 16, wherein said reference frequency is an output of an oscillator, and said variable frequency is a feedback frequency, and wherein said logic pulses drive a charge pump, said charge pump being used in one of a phase-locked loop and a delay-locked loop.

18. The apparatus of claim 16, wherein said small phase difference is less than twenty pico seconds.

19. The apparatus of claim 16, wherein said reference frequency is greater than fifty gigahertz.

20. The apparatus of claim 16, wherein said reference frequency has a duty cycle of fifty percent.

* * * * *

UNITED STATES PATENT AND TRADEMARK OFFICE
CERTIFICATE OF CORRECTION

PATENT NO. : 6,803,753 B2
DATED : October 12, 2004
INVENTOR(S) : Lu

It is certified that error appears in the above-identified patent and that said Letters Patent is hereby corrected as shown below:

Column 6,
Line 35, after "circuit" insert -- means --.

Signed and Sealed this

Thirty-first Day of May, 2005

JON W. DUDAS
*Director of the United States Patent and Trademark Office*